United States Patent [19]

Yamamoto et al.

[11] Patent Number: 5,223,676
[45] Date of Patent: Jun. 29, 1993

[54] COMPOSITE CIRCUIT BOARD HAVING MEANS TO SUPPRESS HEAT DIFFUSION AND MANUFACTURING METHOD OF THE SAME

[75] Inventors: Masaaki Yamamoto; Hiroshi Yatabe, both of Yokohama; Kenzo Kobayashi, Tokyo; Hajime Mochizuki, Tokorozawa, all of Japan

[73] Assignee: The Furukawa Electric Co., Ltd., Tokyo, Japan

[21] Appl. No.: 615,337

[22] Filed: Nov. 19, 1990

[30] Foreign Application Priority Data

Nov. 27, 1989 [JP] Japan .................. 1-136110[U]
Mar. 30, 1990 [JP] Japan ...................... 2-80679
Sep. 20, 1990 [JP] Japan .................. 2-98132[U]

[51] Int. Cl.⁵ ............................................. H05K 1/00
[52] U.S. Cl. .................................. 174/250; 174/262; 29/846
[58] Field of Search ............... 174/250, 251, 259, 254, 174/255, 261, 262, 260; 29/825, 846; 156/901, 902

[56] References Cited

U.S. PATENT DOCUMENTS

| | | | |
|---|---|---|---|
| 4,446,188 | 5/1984 | Patel et al. | |
| 4,521,262 | 7/1985 | Pellegrino | 156/902 X |
| 4,694,120 | 9/1987 | Accon | 174/261 |
| 4,729,061 | 3/1988 | Brown | 174/255 |
| 4,845,313 | 7/1989 | Endoh et al. | |
| 4,854,038 | 8/1989 | Wiley | 174/262 |
| 4,859,807 | 8/1989 | Swiggett | 174/259 |
| 4,866,571 | 9/1989 | Butt | 174/260 |
| 4,972,050 | 10/1990 | Hammond | 174/251 |

FOREIGN PATENT DOCUMENTS 0332889  9/1989  European Pat. Off. .
0052738  6/1982  Fed. Rep. of Germany .

Primary Examiner—Leo P. Picard
Assistant Examiner—Trinidad Korka
Attorney, Agent, or Firm—Frishauf, Holtz, Goodman & Woodward

[57] ABSTRACT

The composite circuit board comprises a substrate made of an insulating material, a thick circuit conductor, embedded in this substrate, which includes a given portion for connecting components to the thick circuit conductor and has a predetermined circuit pattern, a thin circuit conductor, provided on the surface of the substrate, which includes a land corresponding to the parts-mounting section of the thick circuit conductor and has a predetermined circuit pattern, and a conductor for electrically connecting the land and the given portion of the thick circuit conductor. In this circuit board, the land and the given portion of the thick circuit conductor are connected by a conducting member provided in the through hole.

8 Claims, 3 Drawing Sheets

COMPOSITE CIRCUIT BOARD HAVING MEANS TO SUPPRESS HEAT DIFFUSION AND MANUFACTURING METHOD OF THE SAME

BACKGROUND OF THE INVENTION

1. Field of the Invention

The present invention relates to a composite circuit board having a thick circuit conductor and thin circuit conductor, and its manufacturing method.

2. Description of the Related Art

A circuit board through which a relatively large electrical current, for example, one for driving a motor flows requires a circuit conductor having a large cross-sectional area. A conventional circuit board of this type has a structure in which a punched-out circuit conductor made by punching out a desirable circuit pattern from a metal plate (copper, aluminum, etc) is integrally fixed on an insulation substrate (see Published Unexamined Japanese Patent Application (PUJPA) No. 63-237495).

In such a circuit board, to fix a punched-out circuit conductor on an insulation substrate, a copper foil pattern is formed on an insulation substrate, and a punched-out circuit conductor is soldered thereon. This is rather a complicated procedure. Further, the punched-out circuit conductor, which is relatively thick, inevitably creates a bump on the surface of the insulation substrate for its thickness, causing great irregularity on the circuit substrate surface and making matters difficult for printing of a solder resist and circuit conductor to be multi-layered.

SUMMARY OF THE INVENTION

The present invention has been achieved in consideration of the above problems, and the object thereof is to provide a composite circuit board which is easy to manufacture, and suitable to be multi-layered.

Another object of the invention is to provide a composite circuit board in which the parts can be easily mounted.

According to an aspect of the present invention, there is provided a composite circuit board comprising a substrate made of an insulating material, a thick circuit conductor embedded in the substrate, which includes a parts-mounting section and has a predetermined circuit pattern; a thin circuit conductor, provided on the surface of said substrate, which includes a land corresponding to the parts-mounting section of said thick circuit conductor and has a predetermined circuit pattern, and a conductor means for electrically connecting said land and said parts-mounting section.

According to another aspect of the present invention, there is provided a method of manufacturing a composite circuit board, comprising steps of preparing an insulation substrate, embedding a plate for forming a thick circuit conductor, into at least one side of the substrate, the plate being formed into a predetermined pattern and having bridges for connecting conductor portions of the plate, forming an internal circuit plate having a thick circuit conductor with a part-mounting section by removing sections corresponding to the bridges, arranging prepreg sheet and plate for forming a thin circuit conductor in the order mentioned on that side of the internal circuit plate where the thick circuit conductor is formed, integrating the internal circuit plate, the prepreg sheet and the plate for forming a thin circuit conductor, forming a thin circuit conductor formed into a predetermined pattern and having a land at a position which corresponds to that of the part-mounting section of the thick circuit conductor, and forming a through hole for conducting the part-mounting section to the land.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Prior to the present invention, the inventors of this invention discovered a method of manufacturing a circuit board of this type by a hot press method, to 1 solve the problems stated above (Japanese Patent Application No. 1-152241 (not yet published)).

Figure 1:
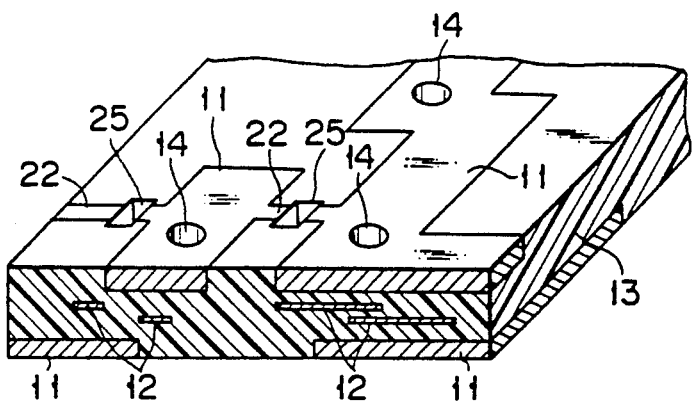
FIG. 1 is a perspective view showing the main section of a composite circuit board having a thick circuit board in its surface area.

FIG. 1 illustrates an embodiment of a composite circuit substrate manufactured by the above method, the figure showing a thick circuit conductor 11 for a large current flow of, for example, a power circuit, thin circuit conductor 12 for a small current flow such as of a signal circuit, and an insulation substrate 13, and through hole 14, the inner surface of which is plated. As shown in this figure, the composite circuit board has a structure in which the thick circuit conductor 11 is embedded in the surface area of the insulation substrate 13, and the thin circuit conductor 12 is embedded in the insulation substrate 13.

Figure 2:
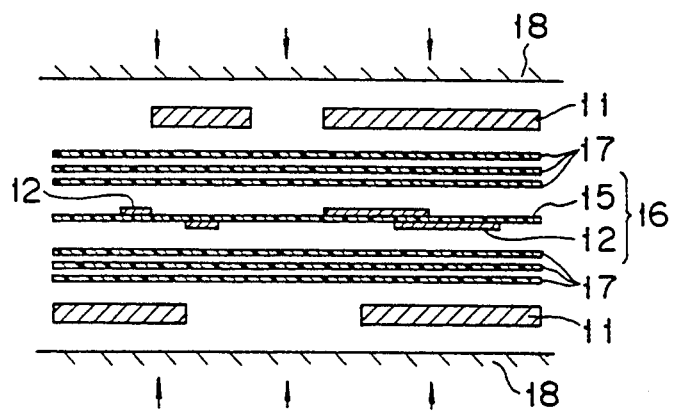
FIG. 2 is a view explaining a method of manufacturing the circuit board shown in FIG. 1.

To manufacture a circuit board of this type, the method shown in FIG. 2 is employed. In this method, first, an internal circuit board 16 having the thin circuit conductor 12 formed by etching a pattern o the copper foil on both (or either) sides (or side) on an insulation sheet 15 is prepared. The appropriate number of prepreg sheets 17 and the thick circuit conductor 11 formed into a desired circuit pattern by the punching-out method are laminated on both sides of the internal circuit board 16, and heated and pressed by hot press machine 18. Thus, the insulation sheet 15 and the prepreg sheets 17 are integrated into the insulation substrate 13 shown in FIG. 1, in the surface area of which the thick circuit conductor 11 is embedded. The thickness of the thick circuit conductor is generally about 0.1-1 mm, and that of the thin circuit conductor 12 is generally 35-70 μm.

Figure 3:
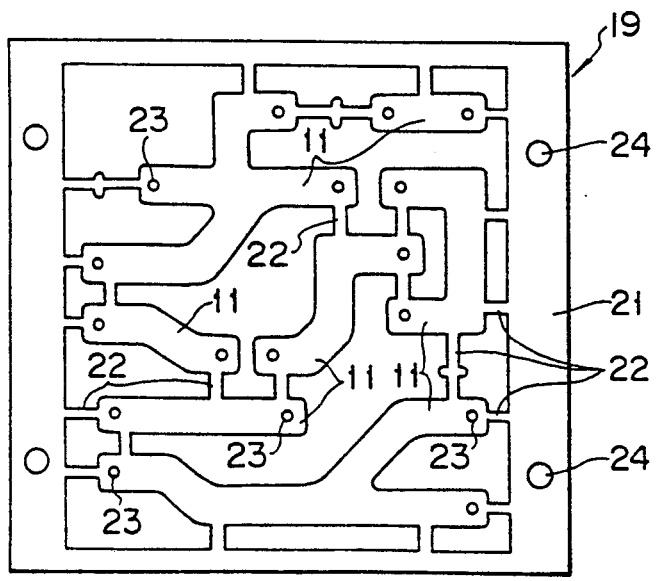
FIG. 3 is a plan view of a circuit pattern of a thick circuit conductor which is prepared by punching-out method.

The thick circuit conductor 11 is punched out into a pattern shown in FIG. 3. With this pattern, a predetermined circuit pattern can be maintained through the punching-out process. More specifically, this thick circuit pattern 19 has an arrangement in which each of the thick circuit conductors 11 are formed into a predetermined circuit pattern in a square frame edge 21, and thick circuit conductors 11 located next to each other are connected by bridges 22, and so are thick circuit conductors 11 and the frame edge 21. Each of the thick circuit conductors 11 has a hole 23 for forming a through hole, and the edge frame 21 has holes 24 for locating the conductor 11.

The bridges 22 are removed by cutting them off or punching them out after integrating them into the insulation substrate 13 as in FIG. 1. In this figure, numerals 25 denotes the sections where the bridges 22 have been removed.

However, due to such a structure in which the thick circuit conductor is embedded in the surface area of the composite circuit board, to mount a part, the lead wire of the part is soldered to the thick circuit conductor. Since the thick circuit conductor has a large heat capacity, the heat is likely to diffuse, making the soldering work very difficult. Further, the sections where the bridges have been removed remain in the form of hole or recess, in which some foreign materials are likely to accumulate, deteriorating the insulating property of the board.

Meanwhile, the composite circuit board of the present invention comprises a substrate made of an insulating material, a thick circuit conductor, embedded in this substrate, which includes a parts-mounting section and has a predetermined circuit pattern, a thin circuit conductor, provided on the surface of said substrate, which includes a land corresponding to the parts-mounting section of said thick circuit conductor and has a predetermined circuit pattern, and a conductor means for electrically connecting said land and said parts-mounting section. Due to this structure, the above-mentioned problems can be solved without extinguishing advantages such as to be easily manufactured, and suitable to be multi-layered.

In other words, such a circuit board can be manufactured by the hot press method as in the case of the above composite circuit board. Therefore, it is easily manufactured and is suitable to be multi-layered. Further, when mounting parts, all that is required is to put the lead wire of a part through the through hole and solder it to the land of the thin circuit conductor, where diffusion of heat is less. Therefore, soldering can be performed easily and the parts can be accurately mounted. Moreover, since the thick circuit conductor is embedded in the insulation substrate, the section where the bridge has been cut off does not appear on the surface thereof, improving the reliability of the circuit in terms of insulation.

The embodiments of the present invention will be described in detail.

Figure 4:
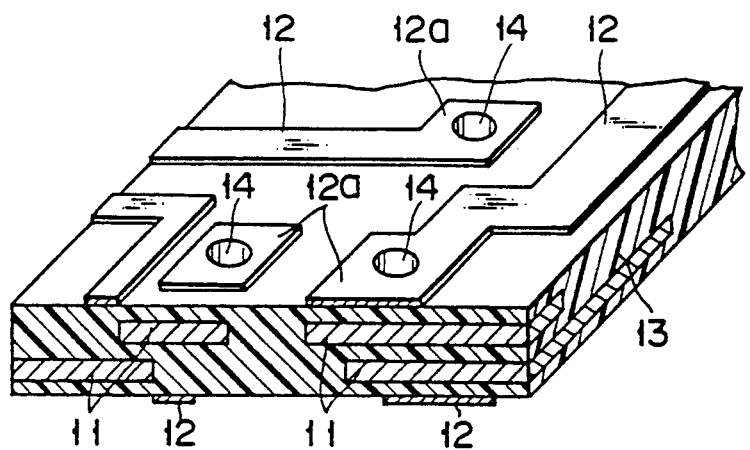
FIG. 4 is a perspective view showing the main section of a composite circuit board according to an embodiment of the present invention.
Figure 5:
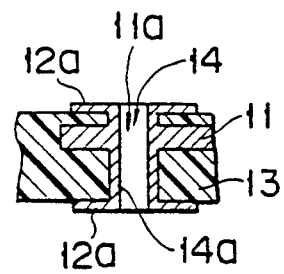
FIG. 5 is a cross section of a conductor means of the circuit board shown in FIG. 4.

FIG. 4 is a perspective view showing the main section of a composite circuit board according to an embodiment of the present invention, and FIG. 5 is a cross section of a through hole forming portion thereof.

In FIGS. 4 and 5 members having the same functions as those of FIG. 1 have the same reference numerals thereof.

The composite circuit board shown in these figures comprises an insulation substrate 13, a thick circuit conductor 11 embedded in the substrate and formed into a predetermined circuit pattern, and a thin circuit conductor 12 provided on the surface of said substrate and formed into a predetermined circuit pattern. As shown in FIG. 5, the circuit conductor 11 includes part-mounting sections 11a on which the parts are mounted, and the thin circuit conductor 12 has lands 12a at the positions corresponding to the part-mounting sections 11a. This composite circuit board has through holes 14 formed thereon so that the parts-mounting sections 11a and lands 12a are connected with each other. A conducting member 14a is formed on the inner wall of each of the through holes 14 by plating.

In the case of such a structure, all that is required in order to mount the parts on the thick circuit conductor 11 is to pass the lead wire of a part through a through hole 14, and solder it to a land 12a of the thin circuit conductor 12. Some of the solder comes into the through hole 14.

Meanwhile, the thick circuit conductor 11 is the same as that shown in FIG. 3, and can be formed into a predetermined circuit pattern by, for example, the punching-out method. Although the thick circuit conductor 11 is embedded into the insulation substrate 13, if the thick circuit conductor 11 is formed as wide as possible, and the insulation layer between the thick and thin circuit conductors 11 and 12 is formed as thin as possible, heat emission upon conducting electricity can be suppressed, and the heat can be radiated.

Figure 6:
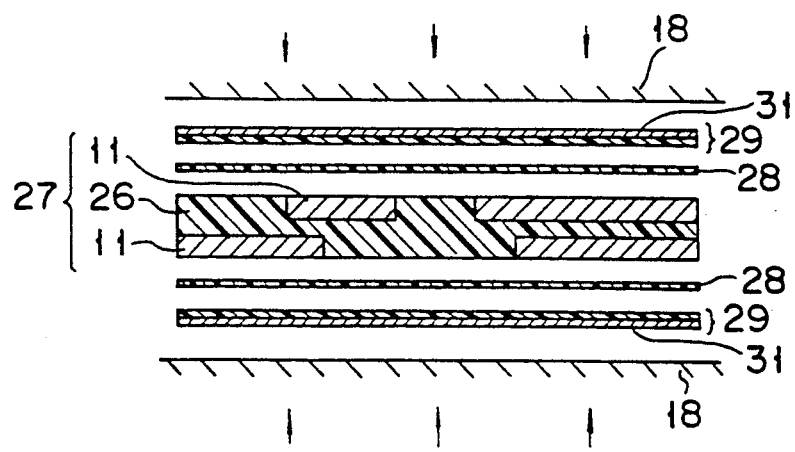
FIG. 6 is a view explaining a method of manufacturing the circuit board shown in FIG. 4.
Figure 7:
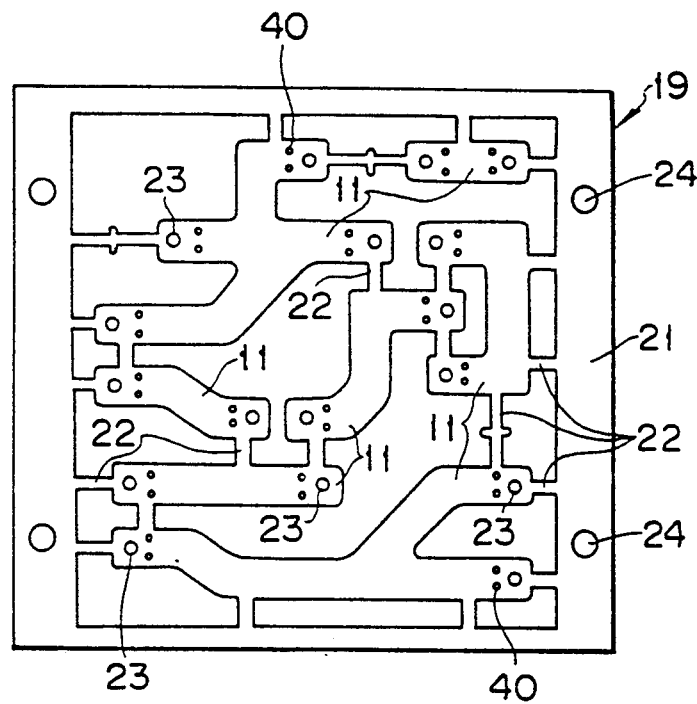
FIG. 7 is a plan view showing of another circuit pattern of the thick circuit conductor which is prepared by the punching-out method.

Such a composite circuit board can be manufactured, for example, as shown in FIG. 6. First, an internal circuit plate 27 in which thick circuit conductors 11 are embedded in both (or either) surface areas of the insulation substrate 26, is formed. To manufacture internal circuit plate 27, a thick circuit pattern, as shown in FIG. 6, which is formed by punching out a copper plate or by etching both surfaces is stacked on both surfaces of a plurality of prepreg sheets prepared by laminating. Then, the circuit pattern is hot-pressed, and the bridges are removed by punching out or cutting off, thereby forming an internal circuit plate 27. Next, the prepreg sheets 28 are stacked on both surface of the internal circuit plate 27, and a copper laminated plates 29 are stacked on the prepreg sheets 28 respectively, with a copper foil 31 facing outside. These laminated layers are heated and pressed into an integrated body by a hot press machine 18. During this step, the holes or recesses formed at the sections where the bridge has been cut off are filled with resin flown out of the prepreg sheets 28. After that, the surface copper foil 31 is etched into a desired pattern to form a thin circuit conductor 12 such as that shown in FIG. 4. The conductor 12 thus formed is worked to make holes, and the inner surface of each of the holes is plated, whereby through holes 14 are completed.

In this embodiment, a thin circuit conductor is formed by etching copper foil into a desired pattern (the subtractive method); however formation of the conductor is not limited to this method. For example, the additive method (in which a circuit pattern is formed on the surface of an insulation substrate by using only electroless plating or using both electrolytic and electroless platings) can be also employed.

The following is an explanation of another embodiment of the present invention.

This embodiment is exactly the same as the other embodiment mentioned previously except for the thick circuit conductor.

The thick circuit conductor 11 is formed of a metal which has a high heat conductivity; therefore soldering heat is likely to diffused to the circuit conductor when mounting the parts. In order for prevention of this heat diffusion, a hole 40 is formed near the part-mounting section of the thick circuit conductor 11. This hole 40 suppresses diffusion of the heat of the part-mounting section of the circuit conductor 11 to the other sections of the conductor. Thus, the temperature of the soldering section of the part-mounting section can be maintained high, and therefore soldering of the parts can be carried out more accurately.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A circuit board comprising:
   a substrate comprising an insulating material, said substrate having a first and a second surface;
   a thick circuit conductor embedded in said substrate, said thick circuit conductor including a given portion thereof to which electrical components are connectable via a first aperture formed in said substrate, said given portion being positioned at a predetermined position within said substrate;
   said thick circuit conductor further having a predetermined circuit pattern;
   a thin circuit conductor having a predetermined pattern provided on at least one of said first and second surfaces of said substrate;
   said thin circuit conductor including a land positioned on said substrate at a location corresponding to said predetermined position of said given portion of said thick circuit conductor;
   conductor means for electrically connecting said land of said thin circuit conductor and said given portion of said thick circuit conductor; and
   said thick circuit conductor having at least a second aperture formed therein adjacent said first aperture for suppressing heat diffusion through said thick circuit conductor.

2. A composite circuit board according to claim 1, wherein said thick circuit conductor includes a circuit pattern having punched-out portions.

3. A composite circuit board according to claim 1, wherein said thin circuit conductor includes an etched circuit pattern.

4. A composite circuit board according to claim 1, wherein said conductor means comprises:
   said first aperture for connecting said land and said given portion of said thick circuit conductor and;
   a conductor member formed on said first aperture.

5. A method for manufacturing a composite circuit board, comprising the steps of:
   providing an insulating substrate having a first and a second surface;
   embedding a thick conductive plate into at least one of said first and second surfaces of said substrate, for forming a thick circuit conductor in said substrate;
   the embedded thick conductive plate having a predetermined circuit pattern in which preselected conductive portions of said pattern are interconnected by a plurality of bridge portions of said pattern, said predetermined circuit pattern of said thick conductive plate including a given portion to which electrical components are connectable via an aperture formed in said substrate, said given portion being positioned at a preset position in said substrate;
   using the thus formed substrate with said thick conductive plate embedded therein and having said predetermined circuit pattern, to form an internal circuit plate by removing at least some of the plurality of bridge portions of said predetermined circuit pattern;
   positioning at least one prepreg sheet over said at least one of said first and second surfaces of said substrate that has said thick conductive plate embedded therein;
   providing a thin circuit conductor over a top one of said at least one prepreg sheet;
   integrating said internal circuit plate, said at least one prepreg sheet, and said thin circuit conductor to form an integrated circuit board;
   forming said thin circuit conductor into a predetermined pattern including a land portion formed at a selected position on said substrate which corresponds to the predetermined position on said substrate of said given portion of said thick conductive plate;
   forming said aperture in said integrated circuit board adjacent said given portion of said thick conductive plate, said aperture having an internal wall; and
   providing conductor means on said internal wall of said aperture for electrically connecting said given portion of said thick conductive plate and said land portion of said thin circuit conductor together.

6. A method according to claim 5, wherein said internal circuit plate is formed by punching-out portions of the thick circuit conductor.

7. A method according to claim 5, wherein the step of forming the predetermined pattern of the thin film conductor comprises etching the thin circuit conductor.

8. A method according to claim 5, wherein each of the at least one prepreg sheets includes a resin and wherein said integrating step comprises hot-pressing said internal circuit plate said at least one prepreg sheet and said thin circuit conductor together so that a plurality of recesses resulting from removing the said at least some of the plurality of bridge portions from said internal circuit plate are filled with the resin which flows from the at least one prepreg sheets during hot pressing.

* * * * *